US006785781B2

(12) United States Patent
Leenstra et al.

(10) Patent No.: US 6,785,781 B2
(45) Date of Patent: Aug. 31, 2004

(54) READ/WRITE ALIGNMENT SCHEME FOR PORT REDUCTION OF MULTI-PORT SRAM CELLS

(75) Inventors: Jens Leenstra, Bondorf (DE); Juergen Pille, Stuttgart (DE); Rolf Sautter, Bondorf (DE); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 09/825,072

(22) Filed: Apr. 3, 2001

(65) Prior Publication Data

US 2001/0034817 A1 Oct. 25, 2001

(30) Foreign Application Priority Data

Apr. 20, 2000 (EP) .............................. 00108699

(51) Int. Cl.[7] .............................................. G06F 12/00
(52) U.S. Cl. ........................ 711/149; 711/150; 711/168; 711/169; 365/189.04; 365/230.05
(58) Field of Search ................................. 711/168, 149, 711/150, 169; 365/230.02, 230.05, 189.02, 189.04

(56) References Cited

U.S. PATENT DOCUMENTS

| | | | | |
|---|---|---|---|---|
| 5,463,591 A | * | 10/1995 | Aimoto et al. ......... | 365/230.05 |
| 5,777,928 A | * | 7/1998 | Vidwans et al. ....... | 365/189.05 |
| 5,813,037 A | * | 9/1998 | Martell et al. ............. | 711/147 |
| 5,828,623 A | * | 10/1998 | Dilbeck ................. | 365/230.05 |
| 5,856,940 A | * | 1/1999 | Rao .......................... | 365/149 |
| 5,905,725 A | * | 5/1999 | Sindhu et al. .............. | 370/389 |
| 5,923,593 A | * | 7/1999 | Hsu et al. .............. | 365/189.04 |
| 5,923,900 A | | 7/1999 | Soell et al. ................. | 710/40 |
| 5,930,491 A | * | 7/1999 | Hilgendorf et al. ......... | 712/209 |
| 5,991,208 A | * | 11/1999 | Aipperspach et al. .. | 365/189.02 |
| 5,991,224 A | * | 11/1999 | Aipperspach et al. .. | 365/230.05 |
| 6,115,294 A | * | 9/2000 | Blomgren et al. ..... | 365/189.02 |

\* cited by examiner

Primary Examiner—Mano Padmanabhan
Assistant Examiner—Jasmine Song
(74) Attorney, Agent, or Firm—Lynn L. Augspurger, Esq.; Blanche E. Schiller, Esq.; Heslin Rothenberg Farley & Mesiti P.C.

(57) ABSTRACT

A considerable amount of area can be saved according to the present invention by reducing the number of input ports and the number of output ports to the number n of concurrently intended array accesses. This remarkable reduction of ports and thus an extraordinary associated area saving can be achieved when some knowledge about array utilization is exploited: The array accesses are to be performed with concurrent accesses from at most k particular groups. A group is defined by a plurality of array accesses which have at most one access to the same port at a time. Then, for reading the read results are aligned according to a simple re-wiring scheme to the respective read requesters, whereas for writing the accesses are aligned prior to the array access according to the same or a similar scheme.

13 Claims, 5 Drawing Sheets

READ/WRITE ALIGNMENT SCHEME FOR PORT REDUCTION OF MULTI-PORT SRAM CELLS

PRIOR FOREIGN APPLICATION

This application claims priority from European patent application number 00108699.0, filed Apr. 20, 2000, which is hereby incorporated herein by reference in its entirety.

TECHNICAL FIELD

The present invention relates to improvement of storage devices in computer systems and in particular, it relates to an improved method and system for efficiently accessing multi-port cell array circuitry.

BACKGROUND ART

In modern computer processor architecture development an increasing portion of processor work is still continued to be parallelized. During parallelization an increasing number of processing sub-units should be allowed and be enabled to access one and the same storage location in order to be able to compute as quickly as possible. Thus, such a storage location requires multiple read/write accessibility.

An example is out-of-order processing. Writing data into arrays of such storage locations in parallel from multiple sources, or reading data from arrays in parallel to multiple targets then requires multi-port cells.

The area and performance of such an array is mainly determined by the number of ports per cell and not by the data size to be stored. More precisely, the area consumption of such an array is nearly proportional to the square of the number of ports implemented.

As one storage cell needs m read ports in order to be readable concurrently by a number of m different reading targets and it needs a number of n write ports for n write sources to write in the cell, and each port comprises a pair of a respective data line and select line being orthogonal to each other, the area consumption increases remarkably with increasing m, or n. For example, when in a m=n=1, two ports case a given array has an area consumption of X, and the array should now be replaced by a multiple access array of m=n=4, 8 ports, then, the resulting area consumption is about (8×8)/(2×2)=16 times higher, i.e., 16 ×. Thus, increasing parallelization requires a large additional area consumption on any processor chip.

Although the present invention has a broad field of application as improving or optimizing storage strategies is a very general purpose in computer technology, it will be described and discussed with prior art technology in a special field of application, namely in context of utilizing a so-called instruction window buffer, further abbreviated as IWB, which is usually present in most modern computer systems in order to enable a parallel program processing of instructions by a plurality of processing units. Such processors are referred to herein as out-of-order processors.

In many modern out-of-order processors such a buffer is used to contain all the instructions and/or register contents before the calculated results can be committed and removed from the buffer. When results were calculated speculatively beyond the outcome of a branch instruction, they can be rejected once the branch prediction becomes wrong just by simply cleaning these entries from the buffer and overwriting them with new correct instructions. This is one prerequisite for the out-of-order processing. One main parameter influencing the performance of the processors is the buffer size: A big buffer can contain many more instructions and results and therefore allows more out-of-order processing. One design objective therefore is to have a big buffer. This however stays in conflict with other design requirements such as cycle time, buffer area, etc. When, for example, the buffer size is dimensioned too large then the efforts required to manage such a large plurality of storage locations decreases the performance of the buffer. Furthermore, increased buffer size implies an increased signal propagation delay. Thus, generally, any improved storage method has to find a good compromise between the parameters buffer size, storage management and therewith storage access speed.

The present invention primarily covers the buffer size and the associated signal propagation delay.

A prior art instruction window buffer as it is disclosed in U.S. Pat. No. 5,923,900, "Circular Buffer With N Sequential Real And Virtual Entry Positions For Selectively Inhibiting N Adjacent Entry Positions Including The Virtual Entry Position", which is hereby incorporated herein by reference in its entirety, is operated according to the following write/read schemes:

With reference to FIG. 1 (prior art), in order to write a package of instructions as depicted in the upper portion of the figure, for example a package of 4 unresolved instructions uip(0:3), into an array in one cycle during the dispatch process a cell is needed with as many write ports as the maximum package size, i.e., a number of k1=4 in this case.

A write decode block 22 translates the write address in (0:5) via control line 16, into input pointer wse10 ... wse13 (0:3) selecting a block of four entries to be written, namely the array entries i, i+1, i+2, i+3. This is depicted schematically in FIG. 1. The first instruction uip0 is written into cell(i) by activating wse10 on input port di0, the next instruction uip1 is written into cell(i+1) by activating wse11 on input port di1, and so on, see the filled circles.

This scheme guarantees that the data is written consecutively into the array. As buffer memories in general are often used in a wrap-around way of operation some special care is required to cover this case, too.

The wrap-around case is handled by the write decoder 22, as well. If for example the window buffer has the total size of 64 entries and a block of four subsequent entries is intended to be written in starting at 62, then, wse1(0:3) point to entries (62,63,0,1).

The read case is similar as revealed from FIG. 2 which depicts the prior art issue filters if0 to if3 controlling an array of 4-read-port cells by read select lines rsel0(0 ... 63), rsel1(0 ... 63), rsel2(0 ... 63), rsel3(0 ... 63). The data is read to several data output ports, i.e. Do(0:3) not explicitly depicted. As many read ports are needed as execution units exists, i.e., instruction execution units (ieu) ieu(0:3) in order to get full parallelism and provide data for all execution units every cycle for the issue process. A routing network can connect each output port of the buffer with each execution unit. An arbitration logic is provided for connecting a particular port with the desired execution unit.

In particular, the instructions ready for execution are identified by valid bits depicted in the upper line of FIG. 2 which are passed to the four different issue filters if(0:3). if0 selects the oldest of all instructions 0 . . . 63 ready for execution, activates rse10 and thereby sends the data to the execution units. Filter if1 ignores the entry detected by if0 and selects the second oldest, activates rsel1 and sends it to the execution units, and so on.

Since any entry of the 64 total entries of the buffer can be first, second, third or fourth selected, any entry and therefore any cell needs 4 read ports. This results in an extremely high area consumption and an associated large signal propagation delay.

SUMMARY OF THE INVENTION

It is thus an objective of the present invention to decrease area consumption and thus increase the efficiency of storage area utilization.

This objective of the invention is achieved by the features stated in enclosed independent claims. Further advantageous arrangements and embodiments of the invention are set forth in the respective subclaims.

A considerable amount of area can be saved according to the present invention by reducing the number of write ports to the number k1 of concurrently intended write accesses and the number of output ports to the number k2 of concurrently intended read accesses to the array. This remarkable reduction of ports and thus an extraordinary associated area saving can be achieved when the intended array 'natural' operation can be expected to be performed in particular groups of concurrent accesses. Of course, k1 and k2 can be different but equal as well for an inventional implementation of the buffer access circuitry.

The present invention is thus useful applicable in hardware circuits comprising multiport arrays and multiport registers.

The array accesses are to be performed with concurrent accesses from at most k1, or k2 particular groups, respectively.

A group is defined by a plurality of array locations for which it is insured that only one read or write access will be necessary at a time. The membership to a group is exclusive, one array entry can not be a member of multiple groups in order to achieve the proposed area reduction.

For example, in a n=64 entries comprising buffer denoted from no. 0 to no. 63, a first group of entries may comprise the entries 0,4,8 . . . 60, the second group may comprise entries 1,5, . . . 61, the third group 2,6, . . . 62, and the fourth group entries 3,7, . . . 63.

Now, having the knowledge that during operation of the buffer only 'bundles' of entries are written or read at a time which follow directly to one another, as is for example at time t=0 a multiple write to entries 23, 24, 25 and 26, or at t=1 a multiple read to entries 44, 45, 46, 47 only one write port and only one read port is needed per entry group as explained above, because, according to the present invention for the reading scheme the read results are aligned to the respective read requesters according to a simple re-wiring scheme, whereas for the writing scheme the data to be written is aligned prior to the array access according to the same or a similar scheme.

Thus, the present invention is based on exploiting the knowledge that in many cases such groups can be identified with some operation analysis, or, these groups are present per se, or, if they are not present a structurization restructuring into such groups can optionally be created by involving additional logic even taking into account some disadvantages which may be caused by the additional logic.

The inventional alignment unit basically comprises a control signal input, a number of k input lines and a number of respective k output lines. Inside, a logic is implemented which switches any of the k input lines to any of the k output lines controlled by the respective control signal. The restriction is, however, that as soon as one input line is associated with a particular output line the rest of the input/output line associations is consequently determined as well. Thus the selection of one input/output association determines all remaining associations which leads to the desired alignment.

Thus, the present invention proposes a new scheme to minimize the number of ports per cell without losing the flexibility to write and read the array in parallel on several, i.e., k1/k2 addresses.

In its general scope with k independent groups and n different requesters being defined the present invention keeps a number of n ports for an array macro, but it reduces the required number of ports from n to the smallest integer which is greater or equal to n/k ports for a cell in the array.

BRIEF DESCRIPTION OF THE DRAWINGS

The present invention is next illustrated by way of example and is not limited by the shape of the figures of the accompanying drawings in which.

BEST MODE FOR CARRYING OUT THE INVENTION

An aspect of the present invention relates to storage devices in computer systems and in particular, it relates to an improved method and system for efficiently operating buffer memories.

With general reference to the figures and with special reference now to FIGS. 3 to 6 the inventional method and a preferred embodiment of an inventional n1=4-write-port/ and n2=4-read-port array storage device is described in more detail.

In particular, an example is given where the general case of n-times multiple accessibility is exemplified in the case n1=n2=n=4 and with the operational restriction that instructions are processed the array accesses of which can be combined into four disjunct groups which in total yield the total of the 64 entries. There are k1=4 groups for the write access and k2=4 groups for the read access.

When k1=k2 then k, or n1=n2 then n will be utilized throughout the present description.

Figure 3:
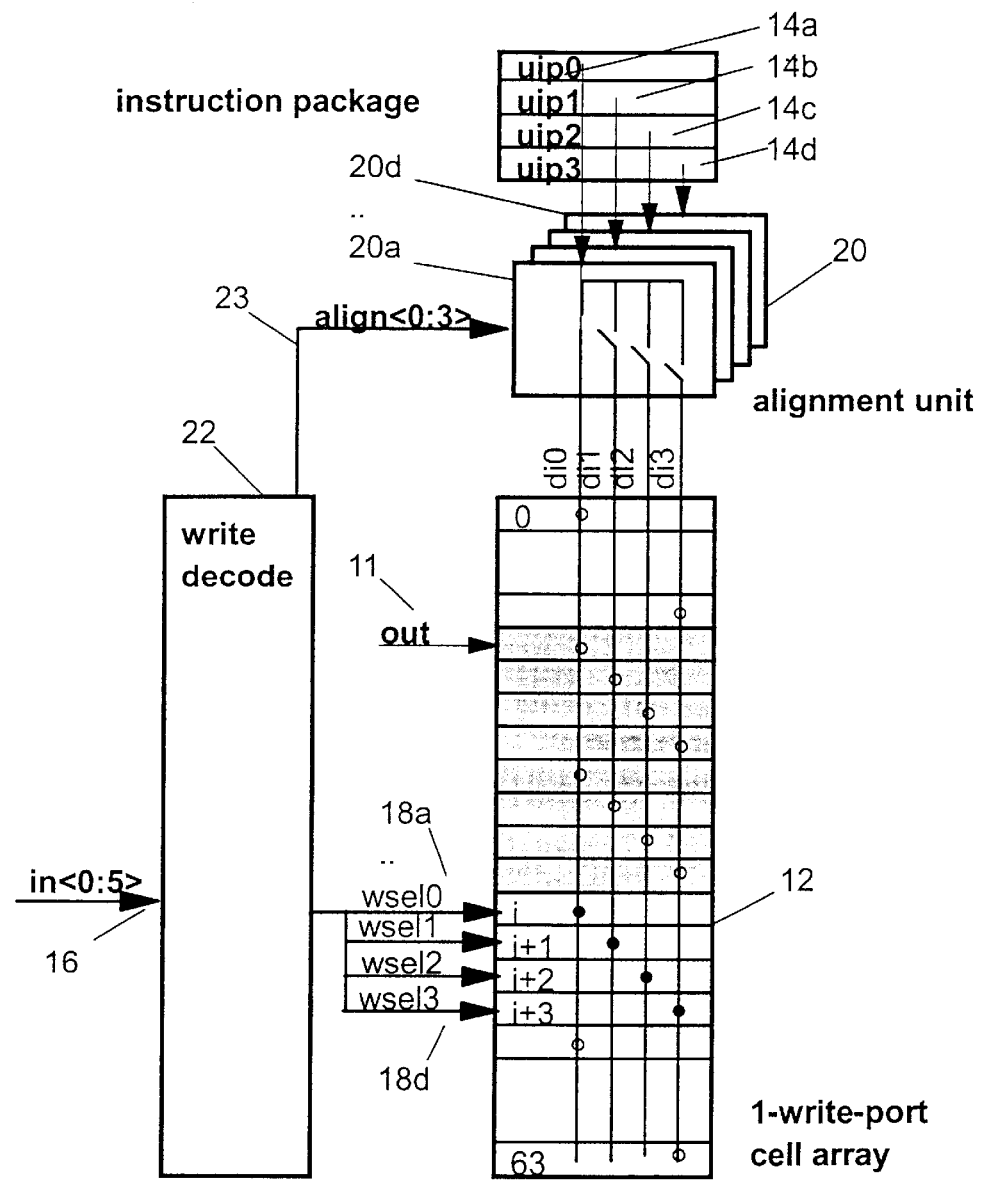
FIG. 3 is a schematical block diagram showing a vertical 'bit column' of an inventional 4-times write scheme of a 4-write-port array block using a 1-write-port cell array.
Figure 4:
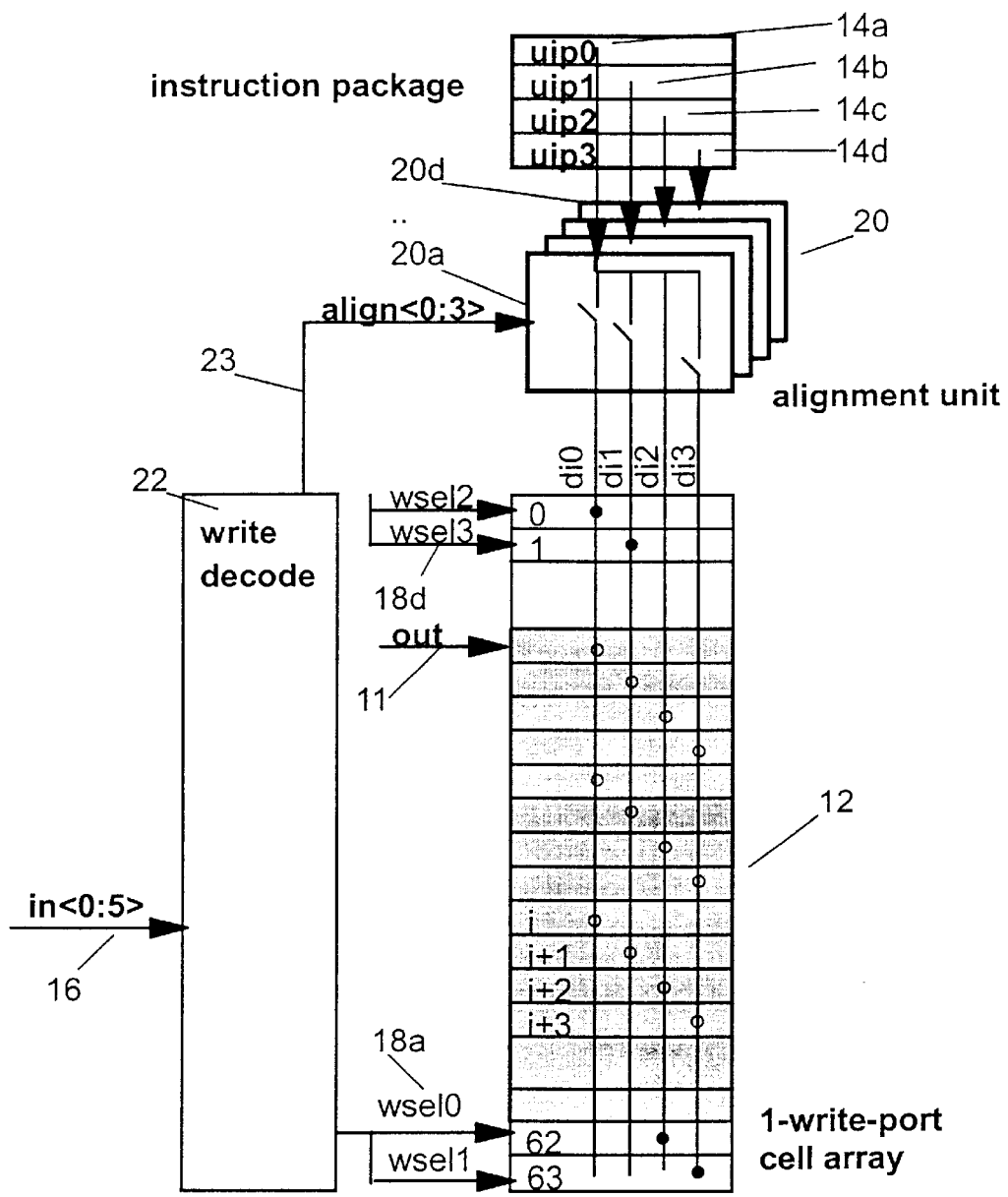
FIG. 4 is a schematical block diagram according to FIG. 3 and covering the wrap-around case.

In particular, in the present embodiment depicted in FIGS. 3 and 4 a plurality of 64 entries comprising buffer is partially depicted, i.e., the large rectangle denoted with reference sign 12 represents a column of 64 bit storing cells, each cell being associated with a respective one of the 64 entries. The number of bits per entry is not discussed in here. The entries are denoted from no. 0 to no. 63.

As mentioned already above four groups of entries are now defined. A first group of entries comprises the entries 0,4,8 . . . 60, the second group comprises entries 1,5, . . . 61, the third group 2,6, . . . 62, and the fourth group entries 3,7, . . . 63. Four vertically extending lines di0 . . . di3 are given in the drawing which represent data which may be written into the bit column 12 at different entry locations at a time. For example, the filled point wsel0/di0 and hitting the bit of entry I i means that this bit can be written in a particular array access. The other three filled points depicted diagonally to the right side and down represent and relating to entries i+1, i+2, and i+3 represent bit locations of the same bit column but belonging to the entries directly subsequent to entry iI. Those filled bit points can be written concurrently during a 4-times write access.

The portion of the bit column between the out-pointer 11 and entry iI represents the area of the bit column in which data are stored which are not yet committed.

First, and with concurrent reference to FIG. 3 and FIG. 4 the write scheme will be explained in more detail next below.

In order to write a package of instructions into the array in one cycle during a dispatching process a write decode block 22 translates the write address given by an IN-pointer via line 16 into an input pointer wsel (0:3) which selects a block of 4 entries which are to be written by the 4-times write access.

In the particular case depicted here, the value of the IN-pointer, in(0 . . . 5), for an instruction i defines the first location of the storage cells intended to be accessed by the total of all 4 intended write accesses. As is depicted in the drawing the write decode block 22 selects four subsequent storage locations via select lines wsel0, . . . wsel3, having reference signs 18a, . . . 18d.

Further, and according to a preferred aspect of the present invention the write decode block 22 is operatively connected via a control line 23 to an alignment unit 20 which comprises 4 different switching schemata 20a, . . . 20d. Each of the switching schemata connects between four data input lines 14a, . . . 14d and a respective one of four data input ports, i.e., write ports, denoted as di0, di1, di2, and di3. Thus, each column of the array can be accessed by a respective data input line.

As already mentioned above particular groups are defined: Group di0 represents entries 0, 4, 8, 12, . . . 60, Group di1 represents entries 1, 5, 9, 13, . . . 61, Group di2 represents entries 2, 6, 10, 14, . . . 62, and Group di3 represents entries 3, 7, 11, 15, . . . 63.

One of a plurality of different switching schemes is described next in the depicted case in which wsel 0 connects to di0.

The switching schemata 20a is depicted explicitly in the drawing. It shows that input 14a can be connected to any data-in line di(0 . . . 3). The same is true for input 14b, 14c and 14d via the switching schemata 20b, 20c and 20d. In the case shown in FIG. 3, 14a is connected to di0 by switching scheme 20a.

The switching scheme 20b solely connects di1 to data input line 14b. Switching scheme 20c connects between di2 and line 14c, and switching scheme 20d connects between data input line di3 and 14d. All other switches are in an open position. The single association between wsel0 and di0 thus defines all remaining associations between write select and data input lines in a sense according to a particular rule meaning that subsequent wsel lines are connected to subsequent data input lines.

The other switching schemes result from cyclically propagating from the first closed switch found.

Of course, other cases can be covered with the inventional concepts in which any different rule is implemented in the alignment unit.

Thus, the first instruction uip0 is written into the storage cell i via wsel0 18a, the next instruction uip1 is written into the storage cell i+1 via wsel 18b, and instructions uip2 and uip3 are written into storage locations i+2 and i+3, respectively in a similar way. Thus, the proposed scheme guarantees that the data is written consecutively into the array.

When for example storage location i=17 is addressed by activation of word select line 18a then, the alignment unit has to connect di1 to 14a, di2 to 14b, di3 to 14c and di0 to 14d, since the storage cell of entry 17 of the array is written to via input port di1, storage cell entry 18 is written via input port di2, storage cell entry 19 is written via input port di3, and storage cell entry 20 is written via input port di0. Thus, four entries of the array can be written in one cycle.

As it appears from the disclosed simple scheme the basic inventional idea is exploited in making use of the consecutive write accesses and in moving the parallelism of several ports inside the cell to the external alignment unit 20. This can generally be achieved by defining a number of four disjunct subsets of entries under the constraint that the total of subset entries is equal to the total of entries.

Thus, logically the array keeps its four input ports but the cells are connected to them alternately. This reduces the number of write ports for the cell to one, which is able to be used as required by the actual write process.

The wrap-around case is depicted in FIG. 4. The same reference signs refer to the same devices, and elements, respectively. For its general description it is referred to the above description of FIG. 3.

In the case depicted here, however, a write to a block starts near the end of the array, as for example at a cell of entry no. 62 as depicted in FIG. 4, and the cells (62,63,0,1) are selected. The alignment unit 20 in turn connects uip(0:3)

to di(2,3,0,1) so that the data is written into the array consecutively, again.

Figure 1:
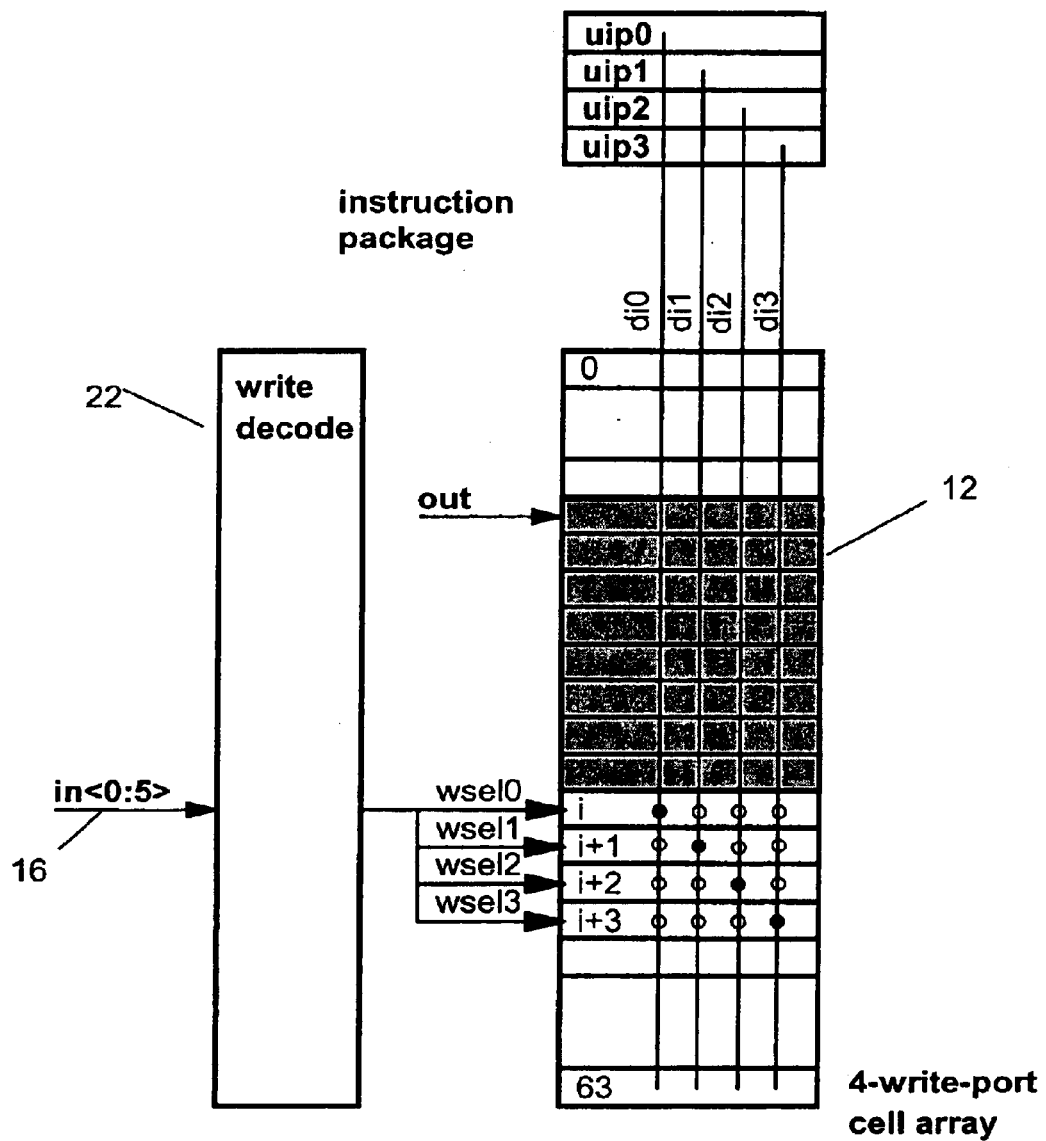
FIG. 1 is a schematical block diagram showing a prior art write scheme using 4-write-port cells.
Figure 2:
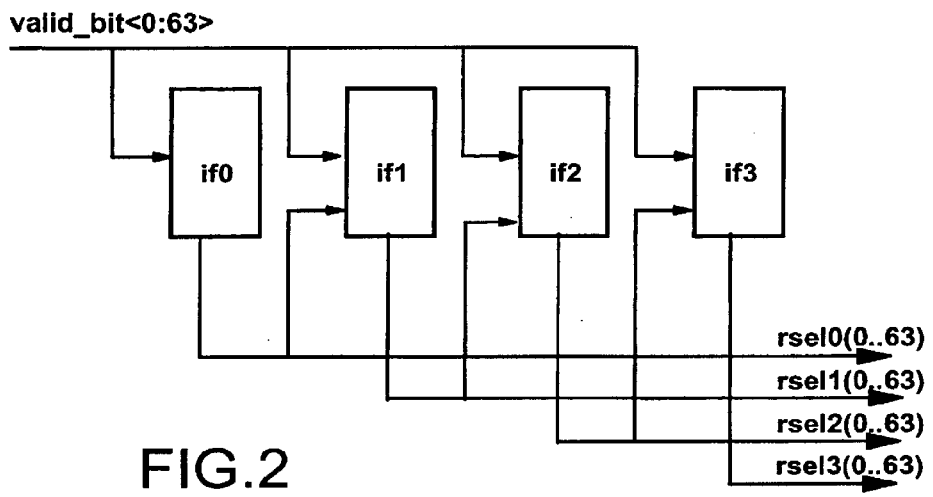
FIG. 2 is a schematical diagram showing a prior art group of issue filters controlling 4-read-port cells.
Figure 6:
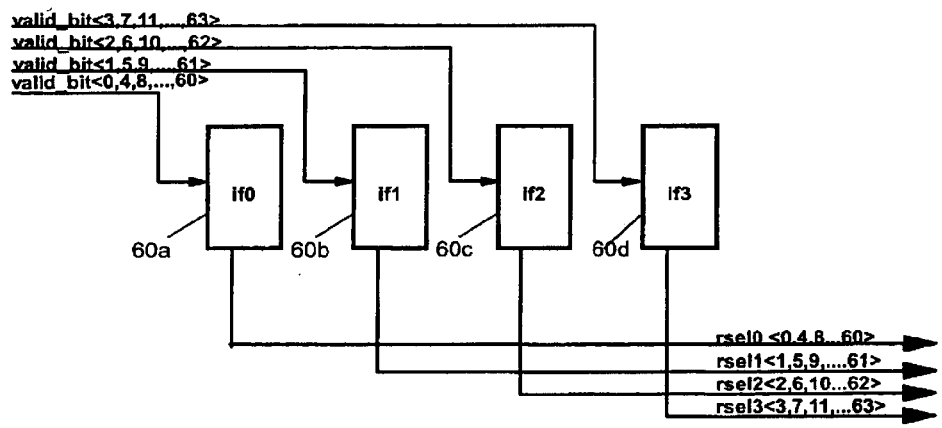
FIG. 6 is a schematical diagram showing an inventional issue filter arrangement controlling a 4-read-port array block using a 1-read-port cell array according to FIG. 5.
Figure 5:
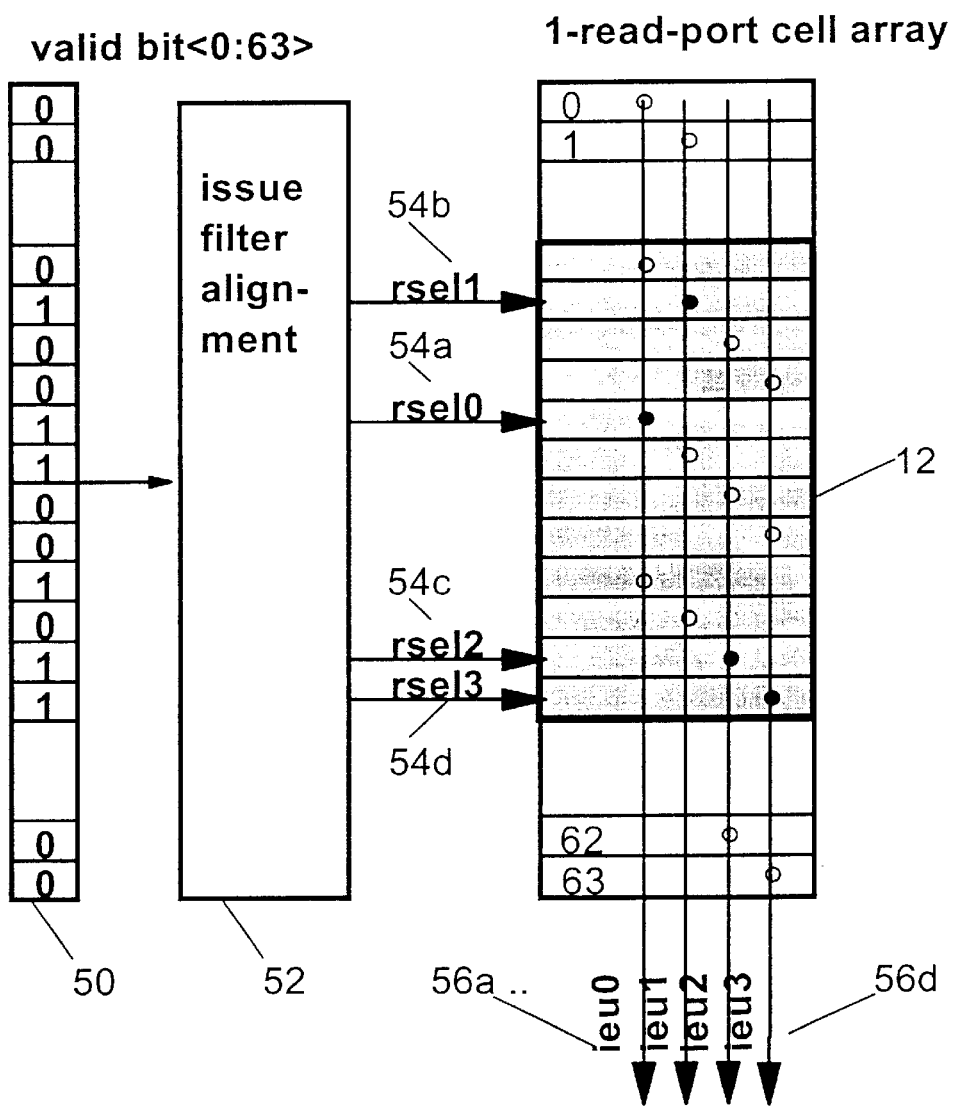
FIG. 5 is a schematical block diagram showing a vertical 'bit column' of an inventional read scheme of a 4-read-port array block using a 1-read-port cell array.

The read scheme is explained in more detail now with reference to FIGS. 5 and 6.

While for writing into the array as described above the data to be written is aligned prior to the array access this is different for the reading scheme: When reading from the array the read results are aligned to the respective read requesters according to the same or a similar scheme because the same number of bit location subsets of a given bit column as described above in the write case is fixedly associated with a respective one of a plurality n of output ports, here, n=4, again in the embodiment of FIGS. 5, 6.

Thus, an execution unit, ieu0, . . . ieu3 is fed with data originating from fixedly determined group member bits which correspond to the same group structure as it was defined for the write case, see above.

Of course, in the read case a different group structure may be chosen as it was done for the write case.

Instructions which are ready for executing are identified by valid bits '1' depicted in an array 50. These valid bits are then passed to an issue filter alignment circuit 52. Circuit 52 is depicted in more detail in FIG. 6. The alignment circuit is connected with four read select lines 54a, 54b, 54c and 54d to the multi-port cell array of which only one bit column 12 is depicted, again. The bit cells stored in the column may be connected to a respective one of four data output lines (do) 56a, 56b, 56c, 56d which fixedly connect to the instruction execution units ieu 0 . . . 3, respectively.

The cells are connected alternately by one read port only, cell (0,4,8, . . . ,60) to do(0), cell (1,5,9, . . . ,61) to do(1), cell (2,6,10, . . . ,62) to do(2) and cell (3,7,11, . . . ,63) to do(3), as it is depicted in FIG. 5.

With special reference to FIG. 6 instructions ready for execute are flagged by valid bits in the active window. The issue is controlled by priority issue filters (if(0), if(1), if(2), if(3)) denoted with reference signs 60a, 60b, 60c, 60d which select the oldest one ready in the active window due to evaluating the respective valid bit groups vd (0,4, . . . 60), . . . (3,7, . . . 63) as depicted in the top portion of FIG. 6. Thus, the rsel signals are deduced from evaluating only a 16 member comprising bit group as defined above. This is depicted for each of the four rsel signals at the bottom portion of FIG. 6.

As can be appreciated by a person skilled in the art as many filters are needed as execution units exist. Each filter is assigned to an execution unit, ieu(i)—controlled by if(i)—is connected to data out port do(i), but only a subset of cells are connected to each port as it was mentioned before. In particular, filter if0 searches the valid bits valid_bit(0,4,8, . . . ,60), if1 searches on valid_bit(1,5,9, . . . ,61), and so on.

It should be noted that having disjunct subgroups reveals the advantage that no controlling between the filters 60 a–d is needed because they work on a separate address space each. Further, the filters are simpler due to 16 instead of 64 inputs.

In case that several instructions are ready which are connected to one data-out port, e.g., do0, but none which are connected to do1, do2 and do3 only one instruction can be executed. Performance analysis showed that this has a very minor effect on CPI performance (cycle per instructions). To avoid this bottleneck, optionally, additional read ports can be used to allow multiple executions even from one subgroup.

As appears from the above description the present invention proposes a new scheme to reduce the number of read and write ports per cell for performance and area reasons without losing the flexibility to write and read in parallel on several ports.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

In particular, the multiply factors n, n1, n2 can be varied freely without being restricted from the inventional principles. Further, the inventional method and storage systems can be advantageously applied for SRAM storage devices.

array size may be varied as well freely as required. In large arrays, the inventional method and system can be applied multiply in parallel to cover read write accesses to a plurality of disjunct array areas.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

What is claimed is:

1. A method for efficiently accessing multi-port cell array circuitry, each cell of said array being usable by an at least n-times multiple concurrent access, the method comprising:

controlling said multiple concurrent access in a plurality of groups, a group being defined by a plurality of array accesses directed to a the same cell port, wherein one array access of the plurality of array accesses is directed to the same cell port at a single time, and wherein the same cell port is unique to the group being defined.

2. The method according to claim 1, further comprising:

aligning the accesses from a number of n1 write requestors to n1 different write ports, followed by writing concurrently to said write ports;

reading from the array by concurrently reading from n2 read ports; and aligning the read result according to the n2 read requestor.

3. The method according to claim 1 used for operating an instruction window buffer memory for processing out-of-order instructions.

4. The method according to claim 1 used for operating a buffer memory in which the operation of a queue is managed.

5. A hardware circuit comprising a multi-port array storage device usable by a n1-times concurrent write access, and a n2-times concurrent read access, said storage device being characterized by comprising:

a plurality of n1 write ports, and n2 read ports;

a controlling means being feedable via a control line with a respective control information specifying which cells are intended to be accessed and arranged for selecting respective word select lines;

a write alignment means comprising at least n1 different switching schemata each connecting between one of the respective data input lines and a respective one of said n1 write ports, and said alignment unit being connectable and controllable by the controlling means for properly selecting a respective data line for each of said data lines; and a read alignment means having a control input and comprising at least n2 different switching schemes for selecting n2 different array entries according to said control input.

6. The hardware circuit of claim 5 in which n1 equals n2.

7. The hardware circuit of claim 5 comprising a multiport array or a multiport register.

8. A sub-unit for use in microprocessor devices having at least one hardware circuit according to claim 5.

9. A microprocessor device having at least one sub-unit according to claim 8.

10. A computer system having a microprocessor device according to claim 9.

11. A computer system having a microprocessor device, said microprocessor device having one or more subunits, at least one subunit of said one or more subunits having one or more hardware circuits, at least one hardware circuit of said one or more hardware circuits comprising a multi-port array storage device usable by a n1-times concurrent write access, and a n2-times concurrent read access, said storage device comprising:

a plurality of n1 write ports, and n2 read ports;

a controlling means being feedable via a control line with a respective control information specifying which cells are intended to be accessed and arranged for selecting respective word select lines;

a write alignment means comprising at least n1 different switching schemata each connecting between one of the respective data input lines and a respective one of said n1 write ports, and said alignment unit being connectable and controllable by said controlling means for properly selecting a respective data line for each of said data lines; and a read alignment means having a control input and comprising at least n2 different switching schemes for selecting n2 different array entries according to said control input.

12. The computer system of claim 11, wherein the at least one hardware circuit comprises a multiport array or a multiport register.

13. The computer system of claim 11, wherein n1 equals n2.

* * * * *

UNITED STATES PATENT AND TRADEMARK OFFICE
CERTIFICATE OF CORRECTION

PATENT NO. : 6,785,781 B2
DATED : August 31, 2004
INVENTOR(S) : Leenstra et al.

It is certified that error appears in the above-identified patent and that said Letters Patent is hereby corrected as shown below:

Column 7,
Line 60, delete "a-dis" and insert -- a-d is --

Column 8,
Line 47, delete the word "the" after the word "a"

Signed and Sealed this

Sixteenth Day of November, 2004

JON W. DUDAS
*Director of the United States Patent and Trademark Office*